(12) United States Patent
Furue

(10) Patent No.: US 6,900,691 B2
(45) Date of Patent: May 31, 2005

(54) SEMICONDUCTOR INTEGRATED CIRCUIT

(75) Inventor: Katsuya Furue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/751,522

(22) Filed: Jan. 6, 2004

(65) Prior Publication Data

US 2005/0046473 A1 Mar. 3, 2005

(30) Foreign Application Priority Data

Aug. 26, 2003 (JP) ........................................ 2003-301820

(51) Int. Cl.$^7$ .............................................. H01L 25/00
(52) U.S. Cl. ........................................ 327/564; 327/565
(58) Field of Search .................................. 327/564–566, 327/199–203

(56) References Cited

U.S. PATENT DOCUMENTS 5,164,817 A * 11/1992 Eisenstadt et al. .......... 327/297

FOREIGN PATENT DOCUMENTS

JP 63-260048 10/1988

* cited by examiner

Primary Examiner—Kenneth B. Wells
(74) Attorney, Agent, or Firm—McDermott Will & Emery LLP

(57) ABSTRACT

A semiconductor integrated circuit includes a first pad mounted on a main surface of a semiconductor substrate, a second pad mounted on the main surface and positioned adjacent to the first pad, a pad joint mounted between the first pad and the second pad to connect the first pad and the second pad, a first signal input/output circuit including a first output buffer connected to the first pad, a second signal input/output circuit including a second input buffer connected to the second pad, and a second output buffer connected to the second pad and including an output section having a controllable output impedance, an input/output signal control circuit connected to the first signal input/output circuit and the second signal input/output circuit. The input/output signal control circuit includes a first latch circuit connected to an input section of the first output buffer, a second latch circuit connected to an output section of the second input buffer, and a control switch connected to an input section of the first output buffer and an input section of the second output buffer.

12 Claims, 10 Drawing Sheets

FIG. 5

| Operation Mode | Signal pin name<br>Test pad input/output status | Control_A | Control_B | Clock_A |
|---|---|---|---|---|
| Normal operation mode | Input | 0 | 0 | 0 |
| | Output | 0 | 0 | 0 |
| First test mode | Input | 0 | 0 | 0 |
| | Output | 1 | 1 | 0 |
| Second test mode | Input | 0 | 0 | 0 |
| | Output | 0 | 0 | 1 |

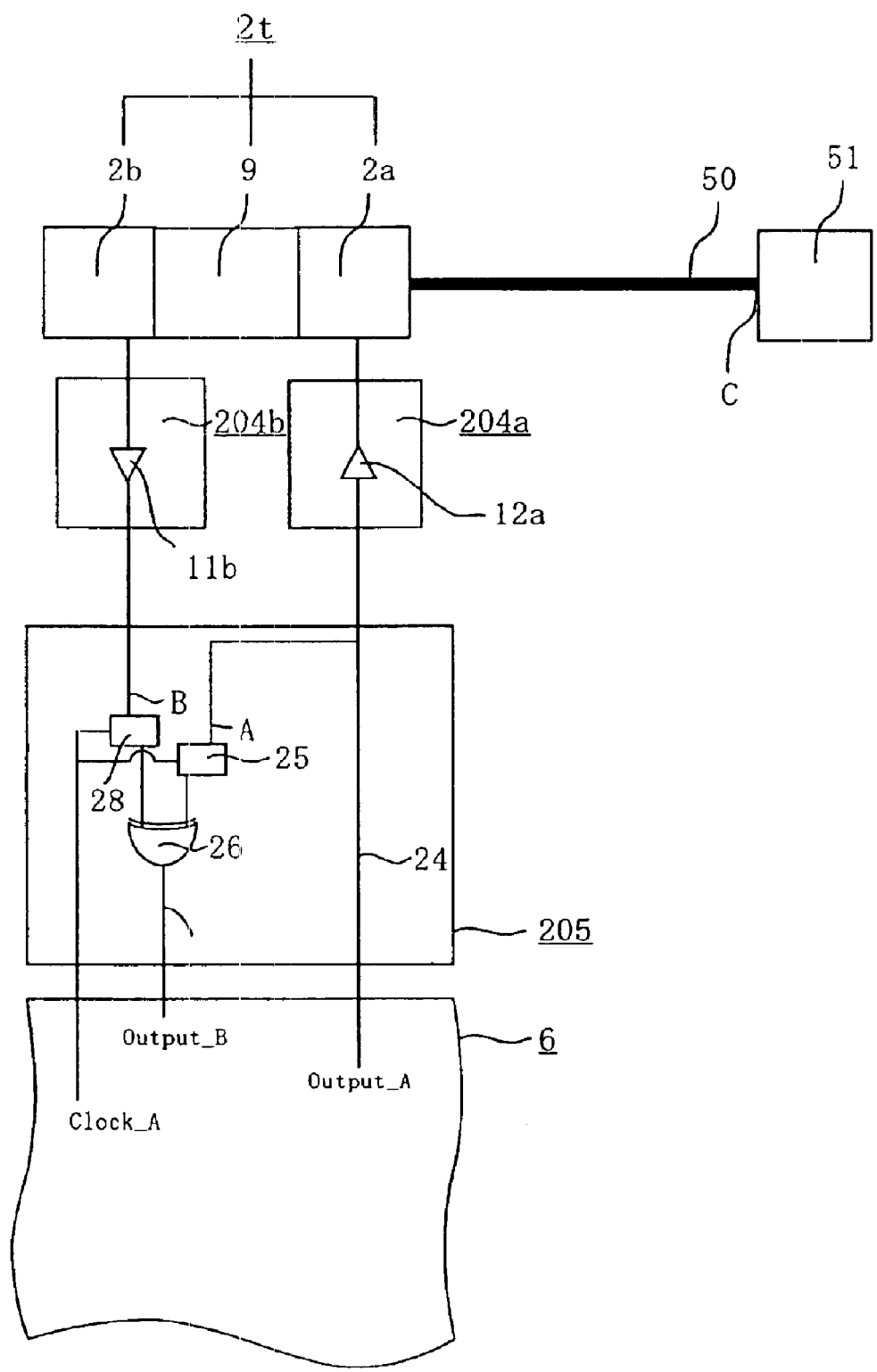

SEMICONDUCTOR INTEGRATED CIRCUIT

BACKGROUND OF THE INVENTION

1. Field of the Invention

The present invention relates to a semiconductor integrated circuit that comprises a pad structure for providing increased ease of testing, a signal input/output circuit, and an input/output signal control circuit.

2. Background Art

The pads for a conventional semiconductor integrated circuit are formed independently of each other. During wafer testing, a probe needle is brought into contact with the pads for supplying a power supply voltage and a test input signal to and acquiring a test output signal from the semiconductor integrated circuit.

Another proposed semiconductor integrated circuit connects a power supply pad to a bonding pad to enhance the power supply accuracy for wafer testing (Japanese Patent Laid-open No. 260048/1988 (FIG. 3, page 3)).

SUMMARY OF THE INVENTION

In recent years, the pads have been reduced in size in order for semiconductor integrated circuit downsizing. Therefore, it is now very difficult to bring the probe needle into contact with each pad.

Further, the current drive capacity of an output buffer for a signal input/output circuit connected to the pads is also decreased to reduce the power consumption of a semiconductor integrated circuit. As a result, the capacitance of a test fixture for use in semiconductor integrated circuit wafer testing cannot be rapidly recharged/discharged. Thus, wafer testing cannot be conducted with high accuracy.

If the current drive capacity of an output buffer decreases, the output buffer's output impedance generally increases. This causes an impedance mismatch between the test fixture and the output buffer, making it impossible to conduct accurate tests.

If the pads for use in wafer testing are increased in size, the probing issue concerning the pads is settled. However, the low current drive capacity issue concerning the output buffer is still not resolved. For some semiconductor integrated circuits, the layout for the pads and the signal input/output circuits connected to the pads is fixed to reduce the design/manufacture period and change the wiring as needed to select the pads and signal input/output circuits to be used. For such semiconductor integrated circuits, however, pad size changes cannot be made because they entail a significant design change.

The probing issue concerning the pads can be resolved if a plurality of pads are joined together, as suggested in Patent Document 1, to increase the pad area with which the probe needle comes into contact. However, the low current drive capacity issue concerning the output buffer is not resolved by the technology disclosed by Patent Document 1.

Aside from the output buffer's current drive capacity, a judgment test needs to be conducted to determine whether the problem of a semiconductor integrated circuit rejected by wafer testing is attributable to a logical failure in the semiconductor integrated circuit or a signal transmission failure between the semiconductor integrated circuit and a testing apparatus. A conventionally conducted signal transmission judgment test requires that a signal waveform be observed with an oscilloscope. The labor requirements for such a signal transmission judgment test are high.

It is an object of the present invention to provide a semiconductor integrated circuit that is improved to resolve the above probing issue concerning the pads as well as the above current drive capacity issue concerning the output buffer and/or the above signal transmission judgment test issue.

According to one aspect of the present invention, a semiconductor integrated circuit includes a first pad mounted on a main surface of a semiconductor substrate, a second pad mounted on the main surface and positioned adjacent to the first pad, a pad joint mounted between the first pad and the second pad to connect the first pad and the second pad, a first signal input/output circuit including a first output buffer connected to the first pad, a second signal input/output circuit including a second input buffer connected to the second pad, and a second output buffer connected to the second pad and including an output section having a controllable output impedance, an input/output signal control circuit connected to the first signal input/output circuit and the second signal input/output circuit. The input/output signal control circuit includes a first latch circuit connected to an input section of the first output buffer, a second latch circuit connected to an output section of the second input buffer, and a control switch connected to an input section of the first output buffer and an input section of the second output buffer.

In the semiconductor integrated circuit according to the present invention, pad probing can easily be accomplished by connecting the first pad and second pad with the pad joint. Further, a first test mode and a second test mode are selectable in addition to a normal operation mode in which the first output buffer outputs an output signal or the first input buffer inputs an input signal. In the first test mode, the first output buffer and second output buffer simultaneously generate outputs signals having the same logic level while the output impedance is set to low with the first control switch turned ON. In the second test mode, the first latch circuit latches a signal input into the first output buffer with specified timing and the second latch circuit latches a signal output from the second input buffer with specified timing. The first test mode provides an advantage of increasing the output buffer's current drive capacity, whereas the second test mode provides an advantage of making it easy to conduct the above signal transmission judgment test.

Other and further features and advantages of the invention will appear more fully from the following description.

BRIEF DESCRIPTION OF THE DRAWINGS

FIG. 5 illustrates various operation modes of the semiconductor integrated circuit in accordance with the first embodiment of the present invention.

FIG. 10 is a block diagram that illustrates in detail a first signal input/output circuit, a second signal input/output circuit, and an input/output signal control circuit of a fifth embodiment of a semiconductor integrated circuit according to the present invention.

DETAILED DESCRIPTION OF THE PREFERRED EMBODIMENTS

Figure 1:
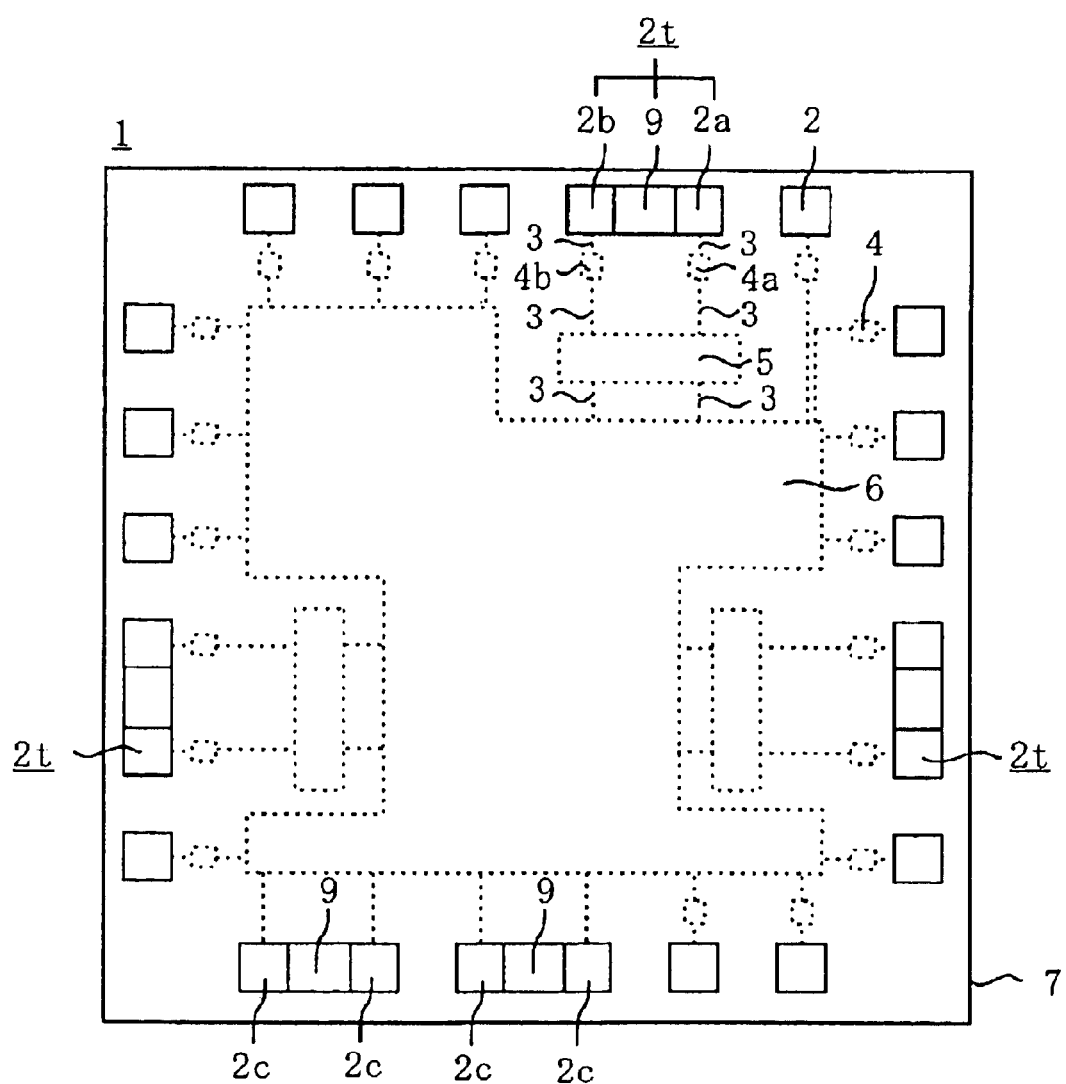
FIG. 1 is a plan view that illustrates a first embodiment of a semiconductor integrated circuit according to the present invention.

Preferred embodiments of the present invention will now be described with reference to the accompanying drawings.
First Embodiment FIG. 1 is a plan view that illustrates a first embodiment of a semiconductor integrated circuit according to the present invention. As shown in this figure, the present embodiment of the semiconductor integrated circuit 1 comprises a pad 2, which comprises aluminum, copper, and other conductors formed on a main surface of a semiconductor substrate 7; a pad joint 9, which electrically connects a first pad 2a and a second pad 2b for constituting a test pad 2t, which is a part of pad 2 and with which a probe needle (not shown) comes into contact at the time of wafer testing, and has a main surface comprising at least aluminum, copper, and other conductors; a signal input/output circuit 4, which is electrically connected to pad 2 via internal wiring 3 that comprises aluminum, copper, and other conductors; an input/output signal control circuit 5 that is electrically connected via the internal wiring 3 to a first signal input/output circuit 4a, which is a part of signal input/output circuit 4 and connected to the first pad 2a, and a second signal input/output circuit 2b, which is connected to the second pad 2b; and an internal circuit 6, which is connected to the input/output signal control circuit 5 via the internal wiring 3. The portion indicated by broken lines in this figure, excluding pads 2, 2a, 2b, and 2c (described later) and the pad joint 9, is covered with a surface protection film (not shown) that is formed on the main surface of the semiconductor substrate 7 to provide protection for the semiconductor integrated circuit 1.

The internal circuit 6 implements the functionality of the semiconductor integrated circuit 1 and includes a logic circuit (not shown) and a storage device (not shown). Pad 2c is a power supply pad that supplies input voltage to the semiconductor integrated circuit 1. It uses a prior art to connect pad 2c with pad joint 9 for the purpose of enlarging the area with which a probe needle comes into contact.

Figure 2A:
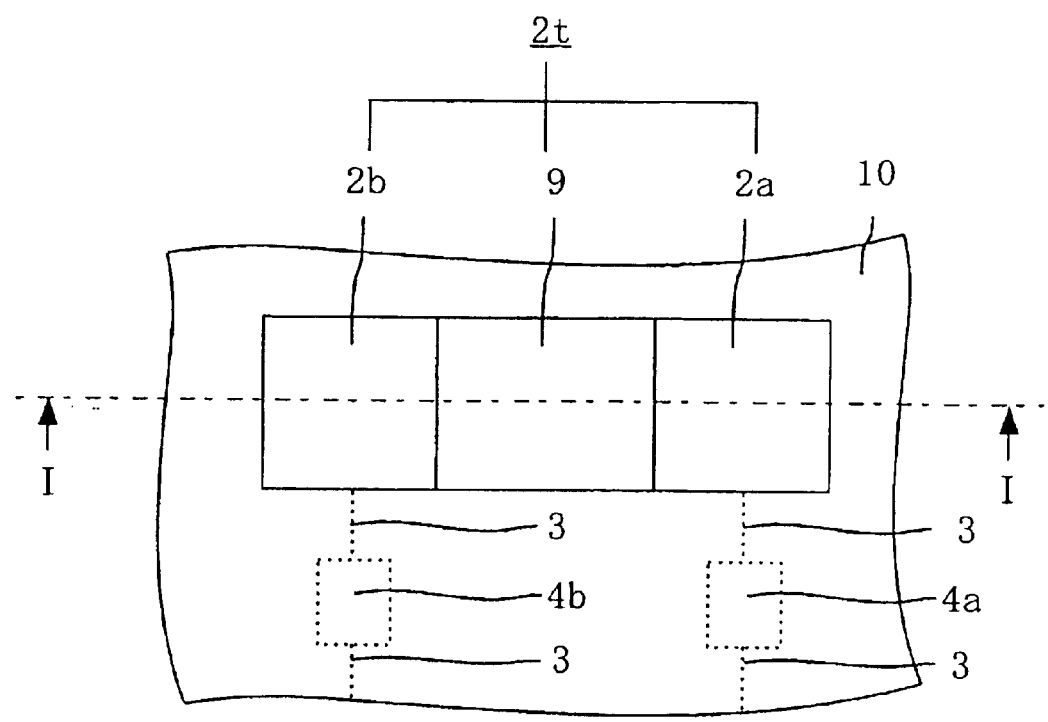
FIG. 2A is a enlarged plan view that illustrates a test pad section of the semiconductor integrated circuit in accordance with the first embodiment of the present invention.
Figure 2B:
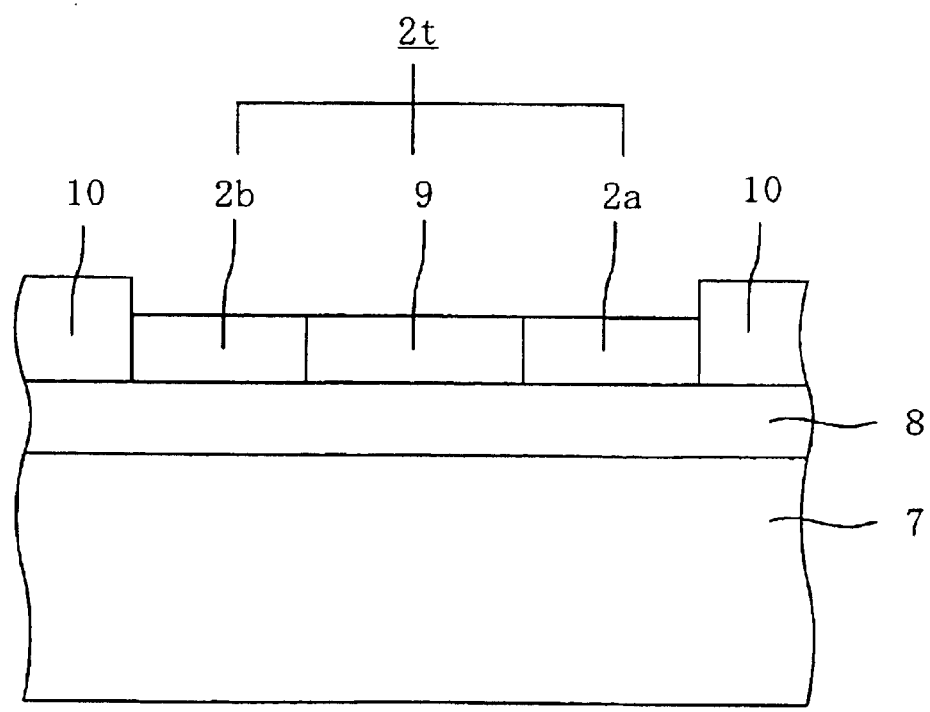
FIG. 2B is a cross-sectional view that shows section I—I of the test pad section.

FIG. 2A is a enlarged plan view that illustrates a test pad section of the semiconductor integrated circuit in accordance with the first embodiment of the present invention. FIG. 2B is a cross-sectional view that shows section I—I of the test pad section. As shown in FIG. 2B, the first pad 2a and second pad 2b are, as is the case with the other pads 2, 2c in FIG. 1, formed on an interlayer dielectric film 8, which is made of silicon dioxide and other dielectric materials and formed on the silicon or other semiconductor substrate 7. The main surfaces of the first pad 2a and second pad 2b are exposed outside the semiconductor integrated circuit 1.

For better contact with the probe needle, the up-down dimension of the pad joint 9 shown in FIG. 2A is rendered the same as those of the first pad 2a and second pad 2b, and the planar shape of the pad joint 9 is rectangular so as to completely fill a gap between the first pad 2a and second pad 2b. Further, the thickness of the pad joint 9 is rendered the same as those of the first pad 2a and second pad 2b as shown in FIG. 2B. As is the case with pads 2, 2a, 2b, and 2c, the main surface of the pad joint 9 is exposed outside the semiconductor integrated circuit 1. The wiring and other items (not shown) on the surface of the interlayer dielectric film 8 on which pads 2, 2a, 2b, and 2c and the pad joint 9 are not formed are provided with a surface protection film 10, which is made of silicon nitride and other dielectric materials to provide protection.

Figure 3:
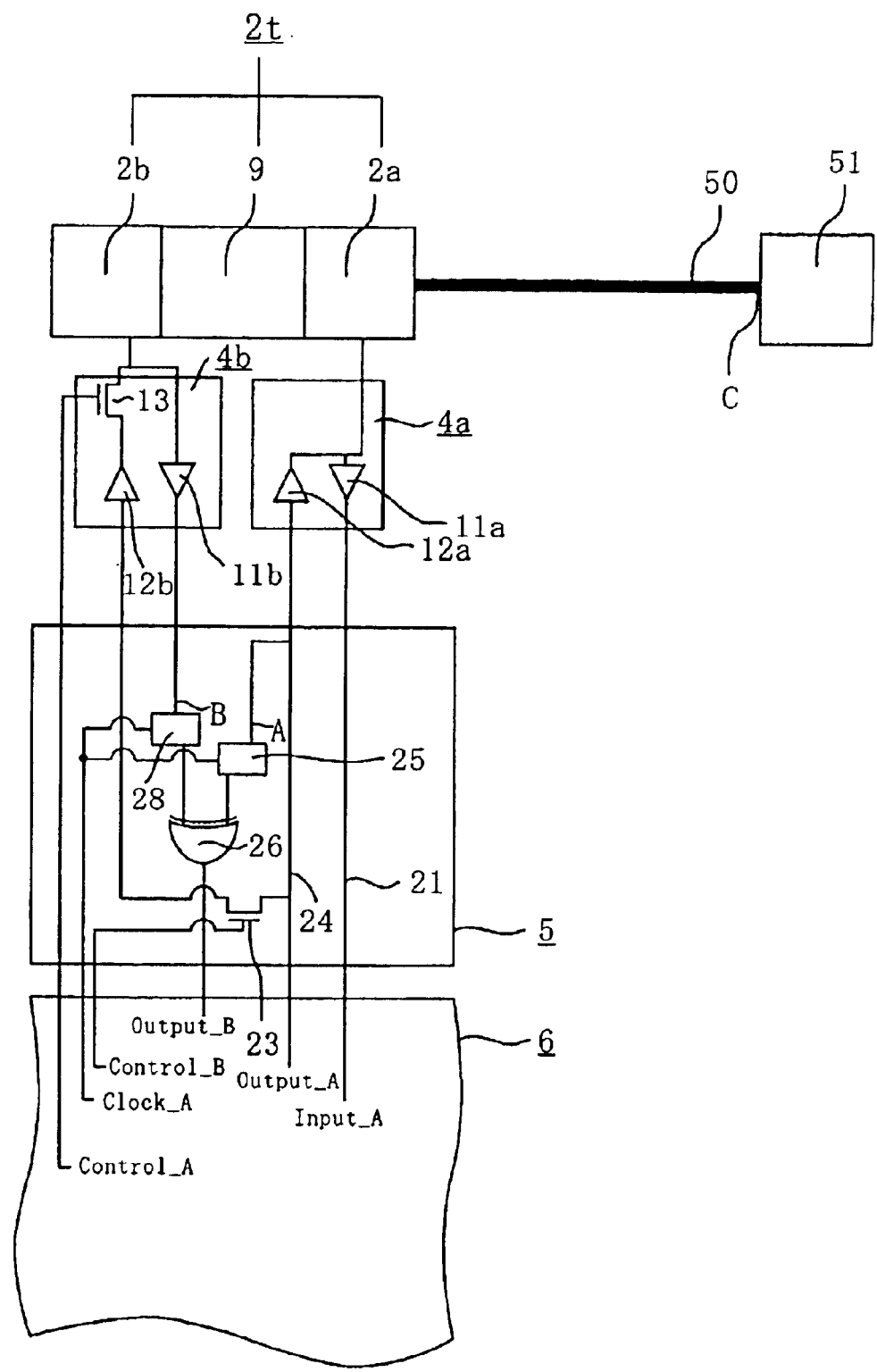
FIG. 3 is a block diagram that illustrates in detail the first signal input/output circuit, second signal input/output circuit, and input/output signal control circuit of the first embodiment according to the present invention.

FIG. 3 is a block diagram that illustrates in detail the first signal input/output circuit, second signal input/output circuit, and input/output signal control circuit of the first embodiment according to the present invention. As shown in FIG. 3, the first signal input/output circuit 4a includes a first input buffer 11a and a first output buffer 12a. The first input buffer 11a and the first output buffer 12a are both connected to the first pad 2a. The second signal input/output circuit 4b includes a second input buffer 11b and a second output buffer 12b. The second input buffer 11b and the second output buffer 12b are connected to the second pad 2b.

As is the case with the first signal input/output circuit 4a and second signal input/output circuit 4b, another signal input/output circuit 4, which is connected to pad 2 shown in FIG. 1, is also provided with an input buffer 11 and output buffer 12.

The semiconductor integrated circuit 1 further comprises a second control switch 13, which is provided in an output section of the second output buffer 12b. The second output buffer 12b is connected to the input sections of the second pad 2b and second input buffer 11b via the second control switch 13. The open/close operation of the second control switch 13 is controlled by control signal Control_A, which is output from the internal circuit 6. Control is exercised so that the output impedance of the output section of the second output buffer 12b is low or high. When the impedance is low, it means that the signal to be output from the second output buffer 12b can be output to the input sections of the second pad 2b and second input buffer 11b, that is, the input sections of the second output buffer 12b, second pad 2b, and second input buffer 11b are electrically connected. When the impedance is high, it means that the signal to be output from the second output buffer 12b cannot be output to the input sections of the second pad 2b and second input buffer 11b, that is, the input sections of the second output buffer 12b, second pad 2b, and second input buffer 11b are electrically insulated from each other.

The input/output signal control circuit 5 comprises wiring 21, which transmits a signal input from the first input buffer 11a to the internal circuit 6 as input signal Input_A. The input/output signal control circuit 5 also comprises wiring 24, which transmits output signal Output_A of the internal circuit 6 to the input section of the first output buffer 12a, one end of the first control switch 23 which is formed within the input/output signal control circuit 5, and the input section of the first latch circuit 25. Wiring 21 and wiring 24 are conductors, which are made, for instance, of aluminum and copper.

The other end of the first control switch 23 is connected to the input section of the second output buffer 12b. The open/close operation of this switch 23 is controlled by a control signal output from pin Control_B within the internal circuit 6.

The output section of the first latch circuit 25 is connected to a comparator circuit 26 that comprises an exclusive-OR circuit formed within the input/output signal control circuit 5. The first latch circuit 25 latches a signal that is input into a signal input section in synchronism with a clock, which is generated from pin Clock_A within the internal circuit and timed as predefined.

The input/output signal control circuit 5 further comprises a second latch circuit 28. The input section of the second latch circuit 28 is connected to the output section of the second input buffer 11b, and the output section of the second latch circuit 28 is connected to the comparator circuit 26. The second latch circuit 28 latches a signal that is input in synchronism with a clock, which is generated from pin Clock_A within the internal circuit 6 and timed as predefined.

The comparator circuit 26 computes the exclusive OR of the outputs of the first latch circuit 25 and second latch circuit 28, and outputs the computation result to pin Output_B within the internal circuit 6.

The control switches 13, 23 may comprise a transistor or the like. In the present embodiment of the semiconductor integrated circuit, these control switches 13, 23 comprise an N-channel MOS transistor.

Figure 4:
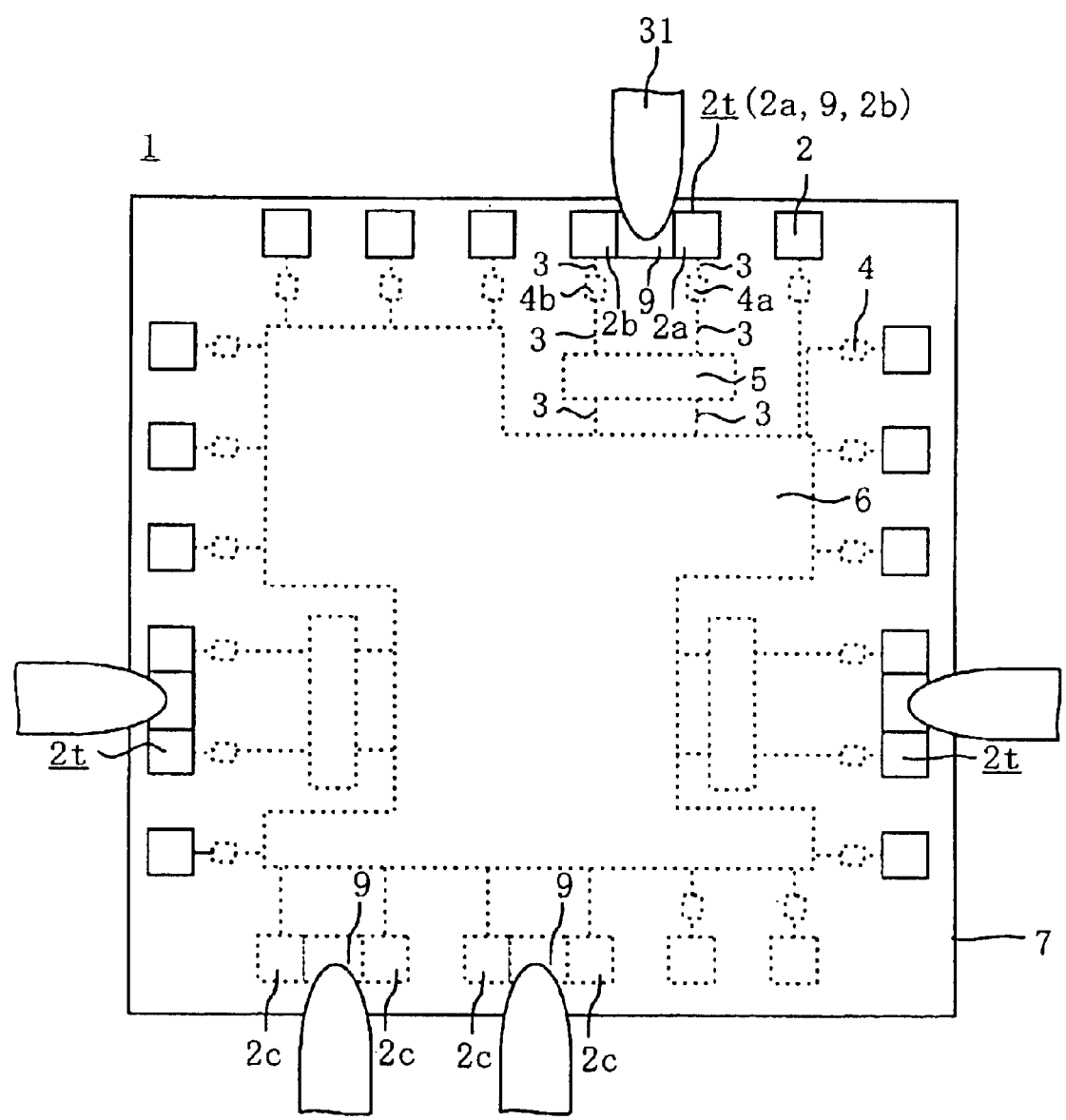
FIG. 4 shows a state that a probe needle comes into contact with the semiconductor integrated circuit in accordance with the first embodiment of the present invention.

A wafer test method for use with the semiconductor integrated circuit 1 will now be described with reference to FIG. 4. To permit signal input/output between the semiconductor integrated circuit 1 and an external testing apparatus (not shown) during wafer testing, it is necessary to bring a probe needle 31 into contact with the test pad 2t and power supply pad 2c. For the present embodiment of the semiconductor integrated circuit 1, the employed test pad 2t is obtained by connecting the first pad 2a and second pad 2b with the pad joint 9. Consequently, the area with which the probe needle 31 can come into contact is large so that the probe needle 31 can steadily come into contact with the test pad 2t.

Further, the pad area is enlarged by the present embodiment of semiconductor integrated circuit 1 because pads 2, 2a, and 2b, which are laid out beforehand, are connected with the pad joint 9. Therefore, it is not necessary to perform a step for new pad design, which imposes considerable labor requirements.

The operations performed by the semiconductor integrated circuit in various operation modes will now be described with reference to FIGS. 3 and 5. FIG. 5 illustrates various operation modes of the semiconductor integrated circuit 1 by presenting the logic values (0: Low level voltage signal output; 1: High level voltage signal output) that are output from pins Control_A and Control_B, which are shown in FIG. 3, and indicating whether a clock is output from pin Clock_A (1: output; 0: not output).

In a normal operation mode, which is indicated in the figure, the semiconductor integrated circuit 1 performs an operation for actual use. In a first test mode and a second test mode, the semiconductor integrated circuit 1 performs a testing operation.

The normal operation mode will now be described. When the semiconductor integrated circuit 1 is in the normal operation mode, the test pad 2t is used for signal input/output necessary for normal operations of the semiconductor integrated circuit 1 as is the case with the other pads 2.

When the test pad 2t functions as an output pad in the normal operation mode, pins Control_A and Control_B output "0", and the first control switch 23 and second control switch 13 open because they comprise an N-channel MOS transistor. Therefore, the signal output from pin Output_A within the internal circuit 6 is amplified by the first output buffer 12a and then output via the test pad 2t to an external device (not shown) that is connected to the test pad 2t.

Even when the test pad 2t functions as an input pad in the normal operation mode, pins Control_A and Control_B output "0". Therefore, the first control switch 23 and second control switch 13 open. Consequently, the signal of the external device (not shown) is delivered to the internal circuit 6 via the test pad 2t and first input buffer 11a.

If the first pad 2a and second pad 2b are connected with the pad joint 9 for the purpose of enlarging the pad area, the first pad 2a is affected by the second signal input/output circuit 4b, which is connected to the second pad 2b. In other words, the output voltage of the second output buffer 12b is output to the second pad 2b to affect the signals that are input to or output from the first pad 2a, which is connected to the second pad 2b. This situation can be avoided if the second output buffer 12b is disconnected from the second pad 2b. In such a condition, however, the existing second output buffer 12b does not function at all and becomes wasted.

In the present embodiment, the second control switch 13 can electrically disconnect the second output buffer 12b from the second pad 2b as described above. That is, the output section of the second output buffer 12b can be set to high impedance. Therefore, the first pad 2a can remain unaffected by the second output buffer 12b during a normal operation. Meanwhile, the second control switch 13 can electrically connect the second output buffer 12b to the second pad 2b. Therefore, the second output buffer 12b can be effectively used to provide increased ease of testing as described later.

The signal output from pin Output_A is also transmitted to the input section of the first latch circuit 25. However, since clock Clock_A is not input into the first latch circuit 25, the first latch circuit 25 does not latch the signal. Therefore, no influence is exerted upon the operation of the semiconductor integrated circuit at all.

The operations performed in the first test mode will now be described. When the test pad 2t is used for signal output with the semiconductor integrated circuit 1 placed in the first test mode, pins Control_A and Control_B output "1". Therefore, the first control switch 23 and second control switch 13 close, setting the output section of the second output buffer 12b to a low impedance. The signal output from pin Output_A within the internal circuit 6 is simultaneously delivered to the first output buffer 12a and second output buffer 12b. The first output buffer 12a and second output buffer 12b then simultaneously output signals having the same logic level. As a result, the test fixture (now shown) is simultaneously driven by these two output buffers 12a, 12b.

In semiconductor integrated circuit wafer testing, a large-capacitance test fixture intervenes between the semiconductor integrated circuit and a testing apparatus. At the time of wafer testing, therefore, the semiconductor integrated circuit must recharge/discharge a capacitance that is larger than in a normal operation. The output buffers for the semiconductor integrated circuit are designed on the presumption that they are used for normal operations. If the test fixture capacitance is large, it cannot be recharged/discharged with specified timing. This gives rise to a situation where semiconductor integrated circuits having no problem with normal operations are found to be defective in a wafer test.

To clear the above problem, the test fixture was conventionally improved by using a considerable amount of manpower and cost. However, the present embodiment of the semiconductor integrated circuit settles the above problem without improving the test fixture because the drive capacity of the test pad 2t can be increased only during a test by making use of the second output buffer 12b that is connected to the second pad 2b at the time of testing.

When the test pad 2t is used for signal input with the semiconductor integrated circuit 1 placed in the first test mode, the control switches 13, 23 open as is the case with the normal operation mode so that the test pad 2t can be used as a large-area pad, which remains unaffected by the second output buffer 12b and allows the probe needle to come into contact with it.

The operations performed in the second test mode will now be described. In the second test mode, a signal transmission judgment test can be conducted with ease. When a semiconductor integrated circuit is found to be defective in a wafer test, the signal transmission judgment test is conducted to determine whether the problem is attributable to a logical failure in the semiconductor integrated circuit or a signal transmission failure between the semiconductor integrated circuit and a testing apparatus.

If pins Control_A and Control_B output "0" when the test pad 2t is used for signal output, the first control switch 23 and the second control switch 13 open. The signal output from Output_A is delivered not only to the first output buffer 12a but also to the input section of the first latch circuit 25. It is then latched in accordance with a clock output from pin Clock_A with specified timing.

Meanwhile, the signal from pin Output_A, which is output from the first output buffer 12a, is delivered not only to the input end (hereinafter referred to as point C) of a testing apparatus 51 via a transmission path 50 including the first pad 2a and test fixture, but also to the input section of the second latch circuit 28 via the pad joint 9, second test pad 2b, and second input buffer 11b. It is then latched in accordance with a clock output from pin Clock_A with the same specified timing as for input signal latching by the first latch circuit 25.

The signal latched by the second latch circuit 28 is obtained by superposing a voltage output from the first output buffer 12a over a voltage reflected and returned from high-input-impedance point C. It nearly corresponds to a waveform of pin Output_A at point C. Therefore, when the comparator circuit 26 compares the signal that is latched by the first latch circuit 25 and not affected by the transmission path 50 against the signal that is latched by the second latch circuit 28 and affected by the transmission path 50, it is easy to judge whether the signal is degraded by the transmission path 50.

If the output from the comparator circuit 26 is "0", which indicates that the output from the first latch circuit 25 is the same as that of the second latch circuit 28, it means that a signal on a specified voltage level is transferred to point C at the time of latching. If, on the other hand, the output from the comparator circuit 26 is "1", it means that a signal on a specified voltage level is not transferred to point C at the time of latching.

Figure 6A:
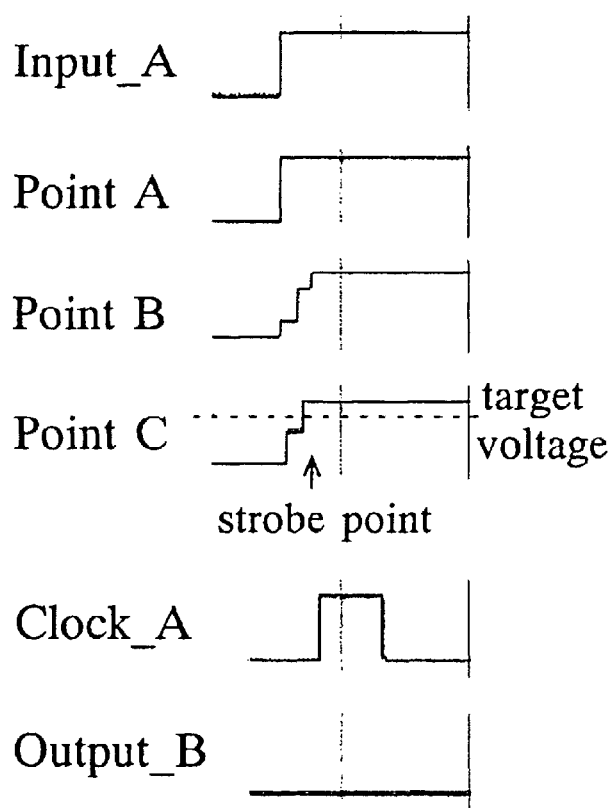
FIGS. 6A and 6B show timing charts of various signals when the semiconductor integrated circuit in accordance with the first embodiment of the present invention is in test mode.
Figure 6B:
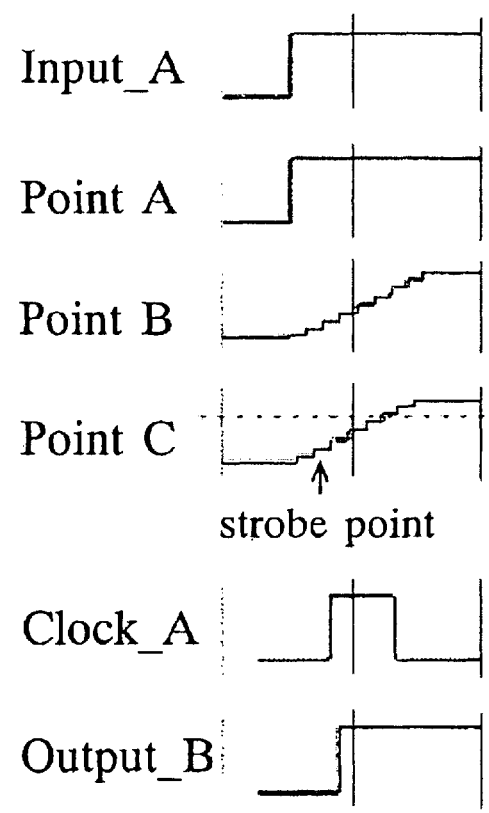

The second test mode will now be described in detail with reference to FIGS. 3 and 6. FIG. 6A shows a case where the output impedance of the first output buffer 12a (Rout) is higher than the impedance of the transmission path 50 (Z) and the difference between these two impedance values is small. FIG. 6B shows a case where the output impedance of the first output buffer 12a (Rout) is higher than the impedance of the transmission path 50 (Z) and the difference between these two impedance values is great. Input_A and Clock_A respectively show the waveforms of signals output from pins Input_A and Clock_A within the internal circuit 6. Points A, B, and C show the waveforms at A, B, and C in FIG. 3. Output_B shows a waveform output from the comparator circuit 26.

In FIG. 6A, the waveform of Input_A transmitted to point C is stepped but reaches the maximum voltage value within a short period of time. Therefore, a satisfactory test result is obtained when a test is conducted to check whether a target voltage indicated for point C is reached at the time of a strobe point indicated for point C.

In FIG. 6B, on the other hand, the waveform of Input_A transmitted to point C is gradually stepped and takes a considerable amount of time to reach the maximum voltage value. Therefore, an unsatisfactory test result is obtained when a test is conducted to check whether a target voltage indicated for point C is reached at the time of a strobe point indicated for point C.

In the present embodiment of the semiconductor integrated circuit 1, the waveform of point A, which reaches the same voltage value as that for point C with nearly the same timing as for a signal waveform of pin Input_A, can be compared against the waveform of point B, which reaches the same voltage value as that for point C with a delay of signal transmission time required for the length of the transmission path 50. Therefore, it is possible to determine the timing and target voltage for Clock_A and examine the signal output to pin Output_B for the purpose of determining whether the Input_A waveform is accurately transmitted to point C at the time of test result generation while considering, for instance, a wafer test strobe point and the time of signal transmission delay over the transmission path 50.

Conventionally, a considerable amount of manpower was used to study a transmission waveform issue because it was necessary to observe a transmission waveform with an oscilloscope or other similar instrument. For waveform observation purposes, a waveform observation probe needle had to be in contact with a pad of a semiconductor device under test. However, a test probe needle was already in contact with the semiconductor device and it was very difficult to bring the waveform observation probe needle into contact with the pad. The present embodiment of the semiconductor integrated circuit, however, can easily identify a failure caused by a transmission path problem as described above.

When the test pad 2t is used for signal input in the second test mode, the test pad 2t can be used as a large-area pad with which the probe needle can come into contact without being affected by the second output buffer 12b by opening the first control switch 23 and the second control switch 13 as is the case with the normal operation mode.

In the present embodiment of the semiconductor integrated circuit 1, Control_A, Control_B, and Clock_A are generated by the internal circuit 6. Alternatively, however, they may be directly given from the outside of the semiconductor integrated circuit 1. When such an alternative configuration is used, each signal can easily be set up from the outside of the semiconductor integrated circuit 1.

The output of the comparator circuit 26 of the present embodiment is connected to pin Output_B within the internal circuit 6. Alternatively, however, the comparator circuit 26 may directly transfer its output to the outside of the semiconductor integrated circuit 1. When such an alternative configuration is used, the comparison result produced by the comparator circuit 26 can be readily observed from the outside of the semiconductor integrated circuit 1. Another alternative is to do without the comparator circuit 26 and directly compare the output signals from the first latch circuit 25 and the second latch circuit 28 with a tester or other instrument external to the semiconductor integrated circuit 1.

If the semiconductor integrated circuit needs to use the test pad as an input pad in neither the normal operation mode nor the test modes, the signal input/output circuit without an input buffer, which is laid out beforehand in the semiconductor integrated circuit, and a pad connected to it may be used as the first signal input/output circuit and the first pad.

Second Embodiment

Figure 7:
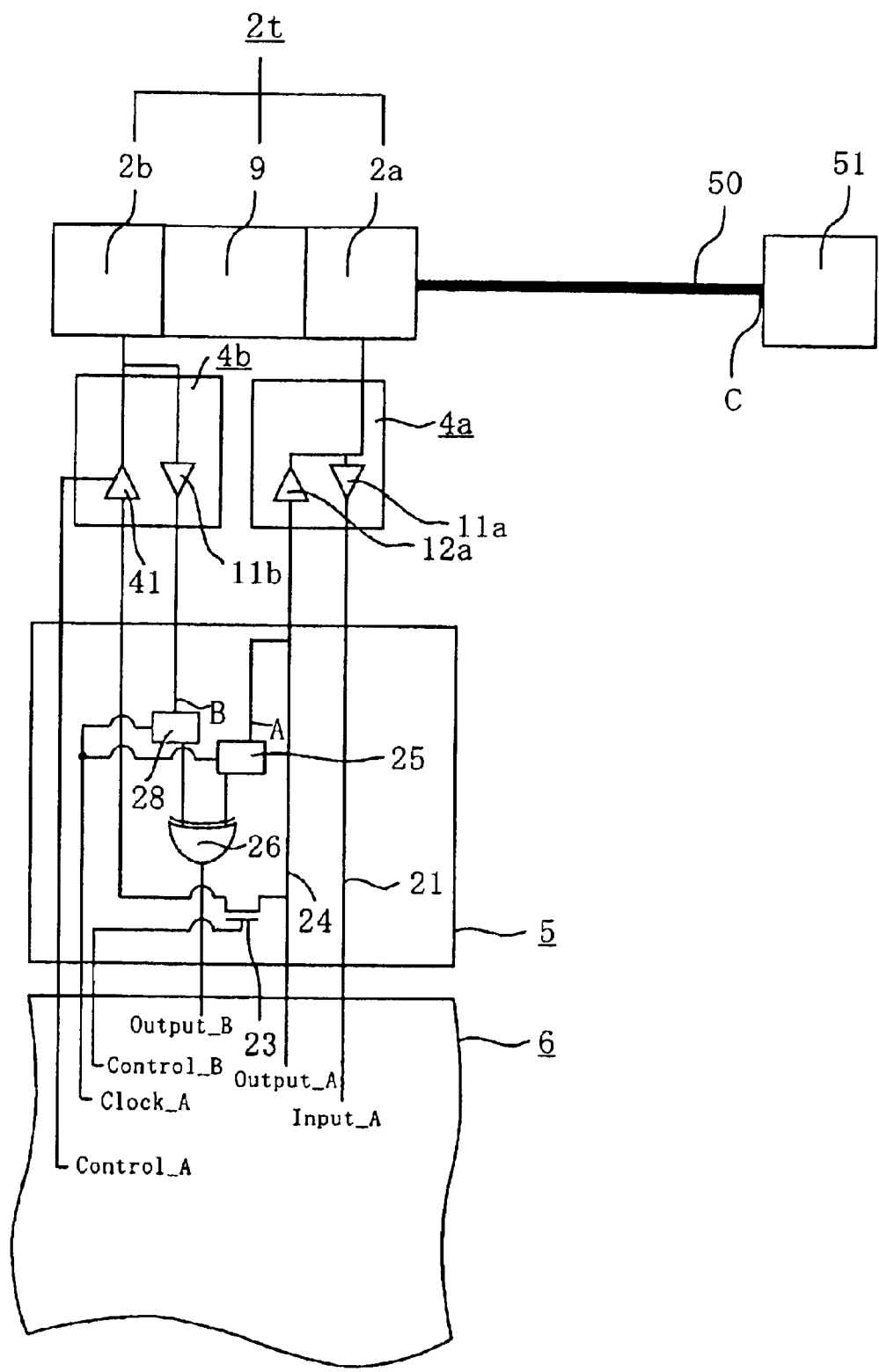
FIG. 7 is a block diagram that illustrates in detail a first signal input/output circuit, a second signal input/output circuit, and an input/output signal control circuit of a second embodiment of a semiconductor integrated circuit.

FIG. 7 is a block diagram that illustrates in detail a first signal input/output circuit, a second signal input/output circuit, and an input/output signal control circuit of a second embodiment of a semiconductor integrated circuit. The second embodiment of the semiconductor integrated circuit is the same as the first embodiment except that the former does not have the second control switch 13 shown in FIG. 3 and that the second output buffer 12b is replaced by a tristate buffer 41 whose output section impedance is controlled by a signal output from pin Control_A. The other portion of the second embodiment is entirely the same as that of the first embodiment. Therefore, like elements are designated by the same reference numerals and will not be described again. The tristate buffer is an output buffer that is capable of setting the output section to a high impedance and generating two different voltage outputs (high and low).

If the output section of the tristate buffer 41 is set to high impedance with the signal output from pin Control_A, the present embodiment of the semiconductor integrated circuit can be placed in the same state as provided by opening the second control switch 13 of the first embodiment. Further, if the signal output from pin Control_A is used to place the output section of the tristate buffer 41 in a low-impedance state where a High or Low voltage can be output, the present embodiment of the semiconductor integrated circuit can be placed in the same state as provided by closing the second control switch 13 of the first embodiment. Therefore, when the above configuration is employed for a semiconductor integrated circuit in which a tristate buffer is used as the output buffer for the signal input/output section, the present embodiment provides the same advantage as the first embodiment and makes it possible to reduce the number of devices necessary for providing increased ease of testing.

Third Embodiment

Figure 8A:
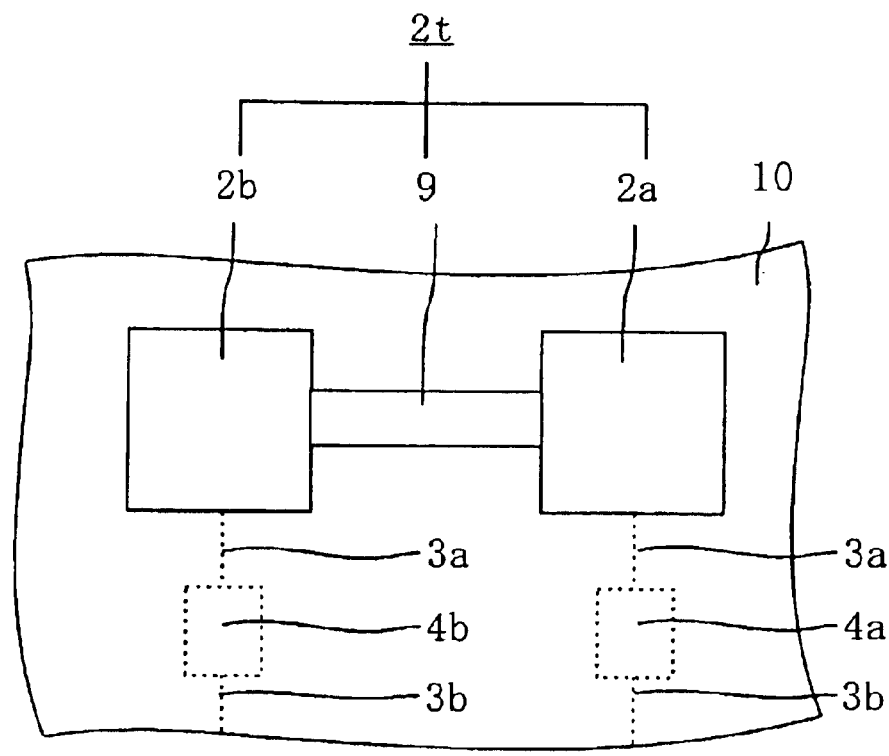
FIGS. 8A and 8B are plan views that illustrate a pad section of a third embodiment of a semiconductor integrated circuit according to the present invention.
Figure 8B:
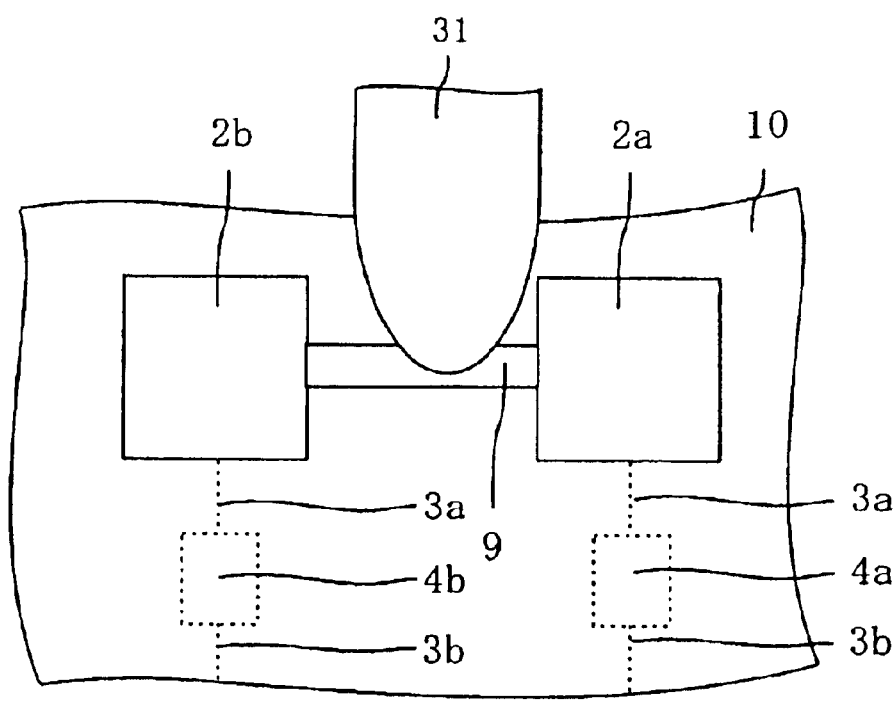

FIGS. 8A and 8B are plan views that illustrate a pad section of a third embodiment of a semiconductor integrated circuit according to the present invention. The third embodiment of the semiconductor integrated circuit is the same as the first embodiment except that the shape of a pad joint 9 differs from the one shown in FIG. 2. Therefore, like elements are designated by the same reference numerals and will not be described again.

To provide the probe needle with an improved contact capability, the first embodiment of the semiconductor integrated circuit employs a rectangular plane to completely fill the gap between the first pad 2a and second pad 2b as shown in FIG. 2A. The thickness of the rectangular portion is rendered the same as those of the first pad 2a and second pad 2b as shown in FIG. 2B. However, the pad joint 9 is merely required to be capable of increasing the pad area with which the probe needle can come into contact and electrically connecting pads 2a and 2b. Therefore, the illustrated up-down dimension of the pad joint 9 may be rendered smaller than those of pads 2a and 2b as shown in FIG. 8A.

In the third embodiment, too, the area with which the probe needle 31 may come into contact is larger than in the use of the first pad 2a alone as shown in FIG. 8B. Further, the first pad 2a and second pad 2b are electrically connected so that the third embodiment provides the same advantage as the first embodiment.

Fourth Embodiment

Figure 9:
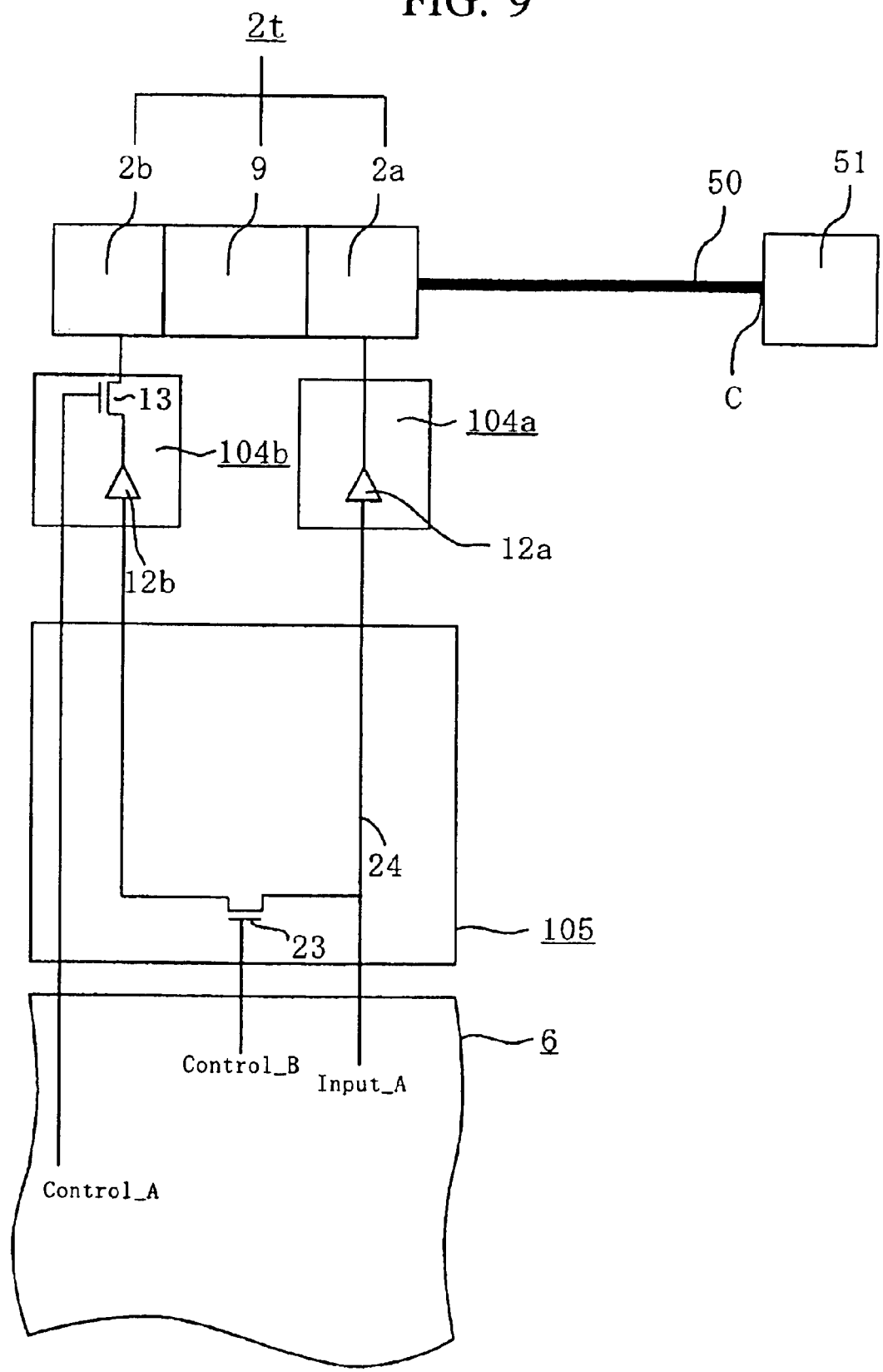
FIG. 9 is a block diagram that illustrates in detail a first signal input/output circuit, a second signal input/output circuit, and an input/output signal control circuit of a fourth embodiment of a semiconductor integrated circuit according to the present invention.

FIG. 9 is a block diagram that illustrates in detail a first signal input/output circuit 104a, a second signal input/output circuit 104b, and an input/output signal control circuit 105 of a fourth embodiment of a semiconductor integrated circuit according to the present invention. The first signal input/output circuit 104a, second signal input/output circuit 104b, and input/output signal control circuit 105 of the fourth embodiment of the semiconductor integrated circuit are a part of the first signal input/output circuit 4a, second signal input/output circuit 4b, and input/output signal control circuit 5 of the first embodiment of the semiconductor integrated circuit, respectively. The fourth embodiment is the same as the first embodiment in the other elements. Therefore, like elements are designated by the same reference numerals and will not be described again.

As shown in FIG. 9, the first signal input/output circuit 104a includes a first output buffer 12a and the second signal input/output circuit 104b includes a second output buffer 12b. The output section of the second output buffer 12b includes a second control switch 13. The second output buffer 12b is connected to a second pad 2b via the second control switch 13. The second control switch 13 opens/closes under control of signal Control_A, which is output from the internal circuit 6, and controls the output impedance of the output section of the second output buffer 12b to set it to high or low.

The input/output signal control circuit 105 includes wiring 24, which transmits output signal Output_A of the internal circuit 6 to the input section of the first output buffer 12a and one end of a first control switch 23 formed in the input/output signal control circuit 105.

The other end of the first control switch 23 is connected to the input section of the second output buffer 12b. The first control switch 23 opens and closes under control of a control signal output from pin Control_B within the internal circuit 6.

Next, the operations that the semiconductor integrated circuit performs in various operation modes will be described with reference to FIGS. 5 and 9. When the semiconductor integrated circuit is in the normal operation mode, pins Control_A and Control_B output "0". Therefore, the first control switch 23 and second control switch 13 open. Thus, the signal output from pin Output_A within the internal circuit 6 is amplified by the first output buffer 12a and output from the test pad 2t.

As described above, while the fourth embodiment of the semiconductor integrated circuit is in the normal operation mode, the test pad can be used as an ordinary signal output pad as is the case with the first embodiment.

If the test pad 2t is used as a test signal output pin while the semiconductor integrated circuit is in the first test mode, pins Control_A and Control_B output "1". Therefore, the first control switch 23 and second control switch 13 close, thereby placing the output section of the second output buffer 12b in a low-impedance state. Thus, the signal output from pin Output_A within the internal circuit 6 is simultaneously delivered to the first output buffer 12a and second output buffer 12b, and the first output buffer 12a and second output buffer 12b simultaneously output signals having the same logic level. As a result, these two output buffers 12a, 12b simultaneously drive the test fixture (not shown).

As described above, the fourth embodiment of the semiconductor integrated circuit can increase the current drive capacity of the test pad 2t at the time of wafer testing, as is the case with the first embodiment. Therefore, a test problem related to the output buffer current drive capacity can be solved. Further, since the test pad 2t is a structure that is obtained by connecting pads 2a and 2b with the pad joint 9, the probe needle can be steadily brought into contact with the test pad at the time of wafer testing.

Fifth Embodiment

FIG. 10 is a block diagram that illustrates in detail a first signal input/output circuit 204a, a second signal input/output circuit 204b, and an input/output signal control circuit 205 of a fifth embodiment of a semiconductor integrated circuit according to the present invention. The first signal input/output circuit 204a, second signal input/output circuit 204b, and input/output signal control circuit 205 of the fifth embodiment of the semiconductor integrated circuit are a part of the first signal input/output circuit 4a, second signal input/output circuit 4b, and input/output signal control circuit 5 of the first embodiment of the semiconductor integrated circuit, respectively. The fifth embodiment is the same as the first embodiment in the other elements. Therefore, like elements are designated by the same reference numerals and will not be described again.

As shown in FIG. 10, the first signal input/output circuit 204a includes an output buffer 12a, whereas the second signal input/output circuit 204b includes a second input buffer 11b.

The input/output signal control circuit 205 includes wiring 24, which transmits output signal Output_A of the internal circuit 6 to a first output buffer 12a and the input section of a first latch circuit 25 formed within the input/output signal control circuit 205.

The output section of the first latch circuit 25 is connected to a comparator circuit 26, which is formed within the input/output signal control circuit 205. The first latch circuit 25 latches a signal that is input into the input section in synchronism with a clock, which is output from pin Clock_A within the internal circuit 6 and timed as specified.

The input/output signal control circuit 5 further comprises a second latch circuit 28. The input section of the second latch circuit 28 is connected to the output section of the second input buffer 11b, and the output section of the second latch circuit 28 is connected to the comparator circuit 26. In accordance with a clock output from pin Clock_A within the internal circuit 6, the second latch circuit 28 latches an input signal with the same timing with which the first latch circuit 25 latches an input signal.

The comparator circuit 26 computes the exclusive OR of the outputs of the first latch circuit 25 and second latch circuit 28 and outputs the computation result to pin Output_B within the internal circuit 6.

Next, the operations that the semiconductor integrated circuit performs in various operation modes will be described with reference to FIGS. 5 and 10. When the semiconductor integrated circuit 1 is in the normal operation mode, the signal output from pin Output_A within the internal circuit 6 is amplified by the first output buffer 12a and output from the test pad 2t.

As described above, while the fifth embodiment of the semiconductor integrated circuit is in the normal operation mode, the test pad can be used as an ordinary signal output pad as is the case with the first embodiment.

The operation performed in a test mode will now be described. This test mode is equivalent to the second test mode of the first embodiment. When the test pad 2t is used for signal output in this test mode, the signal output from Output_A is transmitted not only to the first output buffer 12a but also to the input section of the first latch circuit 25, and latched with timing specified by a clock output from pin Clock_A.

The signal from pin Output_A, which is output from the first output buffer 12a, is delivered not only to the input end (hereinafter referred to as point C) of a testing apparatus 51 via a transmission path 50 including the first pad 2a and test fixture, but also to the input section of the second latch circuit 28 via the pad joint 9, second test pad 2b, and second input buffer 11b. It is then latched in accordance with a clock output from pin Clock_A.

When the signals latched by the first latch circuit 25 and second latch circuit 28 are compared by the comparator circuit 26, it is possible to judge, as is the case with the first embodiment, whether the signal in the transfer path is degraded. Further, since the test pad 2t is a structure that is obtained by connecting pads 2a and 2b with the pad joint 9, the probe needle can be steadily brought into contact with the test pad at the time of wafer testing.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-301820, filed on Aug. 26, 2003 including specification, claims, drawings and summary, on which the Convention priority of the present application is based, are incorporated herein by reference in its entirety.

What is claimed is:

1. A semiconductor integrated circuit, comprising:
    a first pad mounted on a main surface of a semiconductor substrate;
    a second pad mounted on the main surface and positioned adjacent to the first pad;
    a pad joint mounted between the first pad and the second pad to connect the first pad and the second pad;
    a first signal input/output circuit including a first output buffer connected to the first pad;
    a second signal input/output circuit including a second input buffer connected to the second pad, and a second output buffer connected to the second pad and including an output section having a controllable output impedance; and
    an input/output signal control circuit connected to the first signal input/output circuit and the second signal input/output circuit;
    wherein the input/output signal control circuit includes a first latch circuit connected to an input section of the first output buffer, a second latch circuit connected to an output section of the second input buffer, and a control switch connected to an input section of the first output buffer and an input section of the second output buffer.

2. The semiconductor integrated circuit according to claim 1, wherein the first pad and the second pad have substantially a same width, and the pad joint has a same width as the first pad and the second pad and connects the first pad and the second pad.

3. The semiconductor integrated circuit according to claim 1, further comprising a second control switch constituting the controllable output impedance;
    wherein the output section of the second output buffer is connected to the second pad and the second input buffer via the second control switch.

4. The semiconductor integrated circuit according to claim 1, wherein the second output buffer is a tristate buffer.

5. The semiconductor integrated circuit according to claim 1, the semiconductor integrated circuit operating in a normal operation mode or a test mode, wherein in the normal operation mode the first output buffer generates an output signal while the output impedance is set to high with the first control switch turned OFF; and in the test mode the first output buffer and the second output buffer simultaneously generate output signals having the same logic level while the output impedance is set to low with the first control switch turned ON.

6. The semiconductor integrated circuit according to claim 1, the semiconductor integrated circuit operating in a normal operation mode or a test mode, wherein in the normal operation mode the first output buffer generates an output signal while the output impedance is set to high with the first control switch turned OFF; and in the test mode the first latch circuit latches a signal input to the first output buffer with specified timing and latches an signal output from the second input buffer by the second latch circuit with specified timing while the output impedance is set to high with the first control switch turned OFF.

7. The semiconductor integrated circuit according to claim 1, the semiconductor integrated circuit operating in a normal operation mode, a first test mode, or a second test mode, wherein in the normal operation mode the first output buffer outputs an output signal while the output impedance is set to high with the first control switch turned OFF; in the first test mode the first output buffer and the second output buffer simultaneously generate output signals having the same logic level while the output impedance is set to low with the first control switch turned ON; in the second test mode the first latch circuit latches a signal input to the first output buffer with specified timing and the second latch circuit latches an signal output from the second input buffer with specified timing while the output impedance is set to high with the first control switch turned OFF.

8. The semiconductor integrated circuit according to claim 6, wherein the input/output signal control circuit further includes a comparator circuit for comparing the output signals of the first latch circuit and second latch circuit.

9. The semiconductor integrated circuit according to claim 7, wherein the input/output signal control circuit further includes a comparator circuit for comparing the output signals of the first latch circuit and second latch circuit.

10. A semiconductor integrated circuit, comprising:

a first pad mounted on a main surface of a semiconductor substrate;

a second pad mounted on the main surface and positioned adjacent to the first pad;

a pad joint mounted between the first pad and the second pad to connect the first pad and the second pad;

a first signal input/output circuit including a first output buffer connected to the first pad;

a second signal input/output circuit including a second output buffer;

an output section of the second output buffer connected to the second pad and having a controllable output impedance; and an input/output signal control circuit connected to the first signal input/output circuit and the second signal input/output circuit;

wherein the input/output signal control circuit includes a first control switch connected between an input section of the first output buffer and an input section of the second output buffer; in a normal operation mode the first output buffer generates an output signal while the output impedance is set to high with the first control switch turned OFF; and in a test mode the first output buffer and the second output buffer simultaneously generate output signals having the same logic level while the output impedance is set to low with the first control switch turned ON.

11. A semiconductor integrated circuit, comprising:

a first pad mounted on a main surface of a semiconductor substrate;

a second pad mounted on the main surface and positioned adjacent to the first pad;

a pad joint mounted between the first pad and the second pad to connect the first pad and the second pad;

a first signal input/output circuit including an output buffer connected to the first pad;

a second signal input/output circuit including a second input buffer connected to the second pad; and an input/output signal control circuit connected to the first signal input/output circuit and the second signal input/output circuit;

wherein the input/output signal control circuit includes a first latch circuit and a second latch circuit; an input section of the first latch circuit is connected to an input section of the first output buffer; an input section of the second latch circuit is connected to an output section of the second input buffer; in a normal operation mode the first output buffer generates an output signal; and in a test mode the first latch circuit latches a signal input to the first output buffer with specified timing and the second latch circuit latches a signal output from the second input buffer with specified timing.

12. The semiconductor integrated circuit according to claim 11, wherein the input/output signal control circuit includes a comparator circuit for comparing the output signals of the first latch circuit and the second latch circuit.

* * * * *